United States Patent
Stinnett et al.

(10) Patent No.: US 7,095,862 B2
(45) Date of Patent: Aug. 22, 2006

(54) HEADPHONE AMPLIFIER

(75) Inventors: Richard Stinnett, Corona, CA (US); Albert Ray Trussell, Los Angeles, CA (US); Russell D. Bellin, Los Angeles, CA (US)

(73) Assignee: Church of Spirtual Technology, Los Angeles, CA (US)

( * ) Notice: Subject to any disclaimer, the term of this patent is extended or adjusted under 35 U.S.C. 154(b) by 913 days.

(21) Appl. No.: 10/062,950

(22) Filed: Jan. 31, 2002

(65) Prior Publication Data

US 2003/0142834 A1   Jul. 31, 2003

(51) Int. Cl.
*H03F 21/00* (2006.01)
(52) U.S. Cl. ........................ 381/120; 381/74
(58) Field of Classification Search ............... 381/74, 381/120, 384
See application file for complete search history.

(56) References Cited

U.S. PATENT DOCUMENTS

| 6,157,545 A * | 12/2000 | Janninck et al. ............ 361/814 |
| 6,763,111 B1 * | 7/2004 | Liao ............................. 379/446 |
| 6,801,611 B1 * | 10/2004 | Guccione et al. ....... 379/202.01 |
| 2001/0043705 A1 * | 11/2001 | Wilmink ..................... 381/120 |
| 2002/0049003 A1 * | 4/2002 | Narumi et al. .............. 439/680 |
| 2002/0080985 A1 * | 6/2002 | Ho .............................. 381/334 |
| 2004/0096073 A1 * | 5/2004 | Kim, II ...................... 381/120 |
| 2004/0158846 A1 * | 8/2004 | Aizawa et al. ............. 720/652 |

\* cited by examiner

*Primary Examiner*—Brian T. Pendleton
(74) *Attorney, Agent, or Firm*—Birch, Stewart, Kolasch & Birch, LLP; Thomas M. Small

(57) ABSTRACT

A compact portable stereo headphone amplifier system for use with a conventional stereo audio source, such as a cassette or compact disc player, in which components are located on both sides of a circuit board and in which left channel components and right channel components are located on opposite sides of the circuit board thereby providing a compact unit.

3 Claims, 4 Drawing Sheets

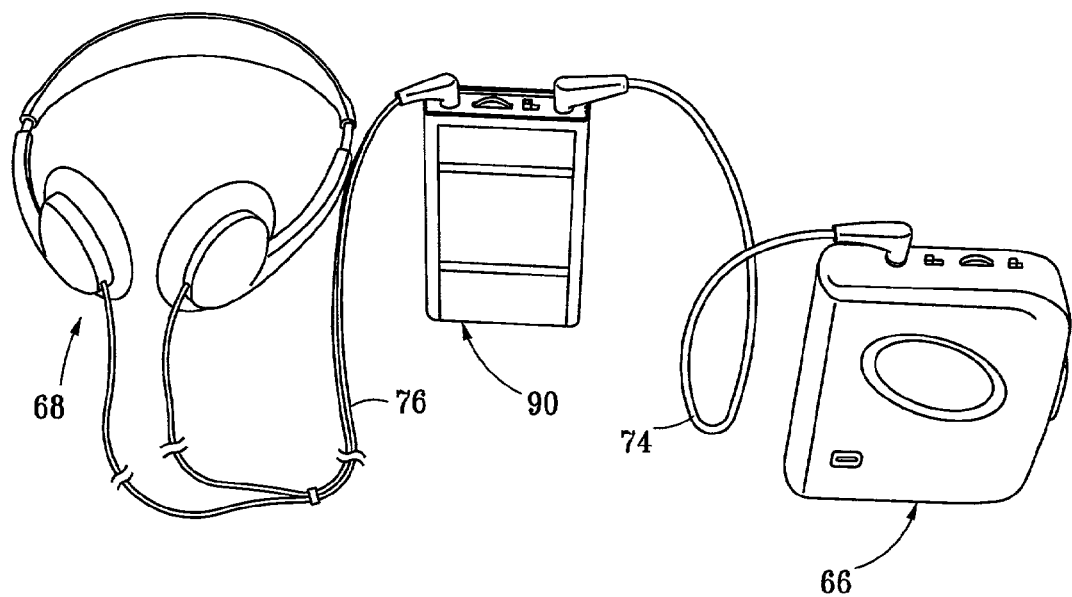
FIG. 1
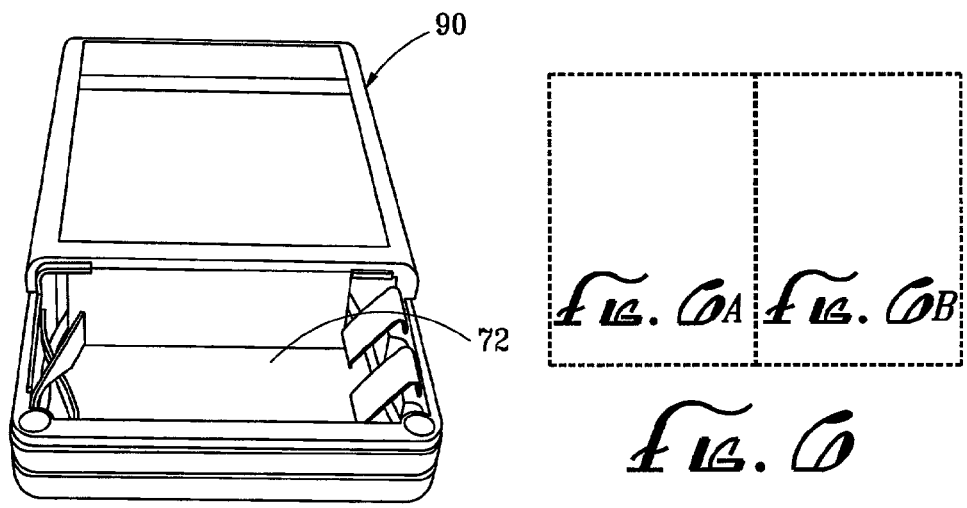
FIG. 5
FIG. 6A | FIG. 6B
FIG. 6

HEADPHONE AMPLIFIER

BACKGROUND OF THE INVENTION

A. Field of the Invention

The present invention relates to a portable stereo headphone system including headphones, stereo audio source and an amplifier external to the headphones and audio source.

B. Description of the Prior Art

External, portable stereo headphone amplifiers are known. However, known portable stereo headphone amplifiers are relatively large, bulky, and have essentially all interior components mounted on a single side of a printed circuit board internal to a housing, extraneous controls and control circuitry and essentially no effective separation between the circuitry and a battery source of power.

OBJECTS AND SUMMARY OF THE INVENTION

It is an object of the invention to provide a compact, external portable stereo headphone amplifier system having improved signal clarity.

It is a further object of the present invention to provide a compact, external portable stereo headphone amplifier having improved protection of its circuitry from damage caused by battery leakage.

It is a further object of the present invention to provide a compact, external portable stereo headphone amplifier having structural components arranged so as to provide for improved convenience and usefulness as a portable amplifier.

It is a further object of the present invention to provide a compact, external portable stereo headphone amplifier having improved separation between its battery source of power and its circuitry so as to minimize impact damage caused by momentum of the battery, and to maximize protection from damage caused by dirt particles or other debris from the battery compartment into the region of the housing which the circuitry is positioned.

BRIEF DESCRIPTION OF THE DRAWINGS

FIG. 1 is an external, prospective view of a preferred embodiment of the portable stereo headphone amplifier system of the present invention.

FIG. 5 is a rear, oblique view of the FIG. 2 amplifier unit case, with the battery compartment cover removed.

FIG. 6 is a block diagram showing the relationship between FIG. 6A and FIG. 6B.

DESCRIPTION OF PREFERRED EMBODIMENTS

Figure 2:
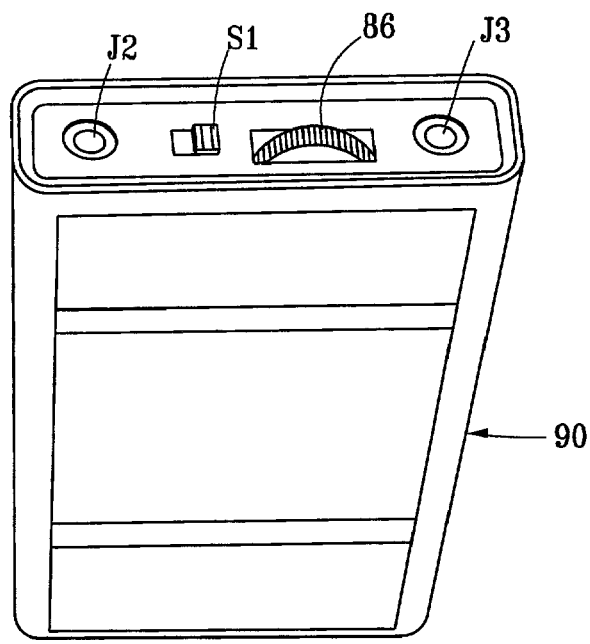
FIG. 2 is a front, external, prospective view of the amplifier unit case or housing of the FIG. 1 embodiment.

Preferred embodiments of the present invention will be described with reference to the accompanying drawings.

FIG. 1 illustrates the present stereo headphone amplifier system, including compact case or housing 90, the input of which amplifier is connected by conventional audio cable 74 to a stereo audio source 66 such as a conventional cassette tape or compact disc player. The output of the stereo amplifier is connected by conventional stereo headphone cable 76 to conventional headphones or earphones 68.

Figure 6A:
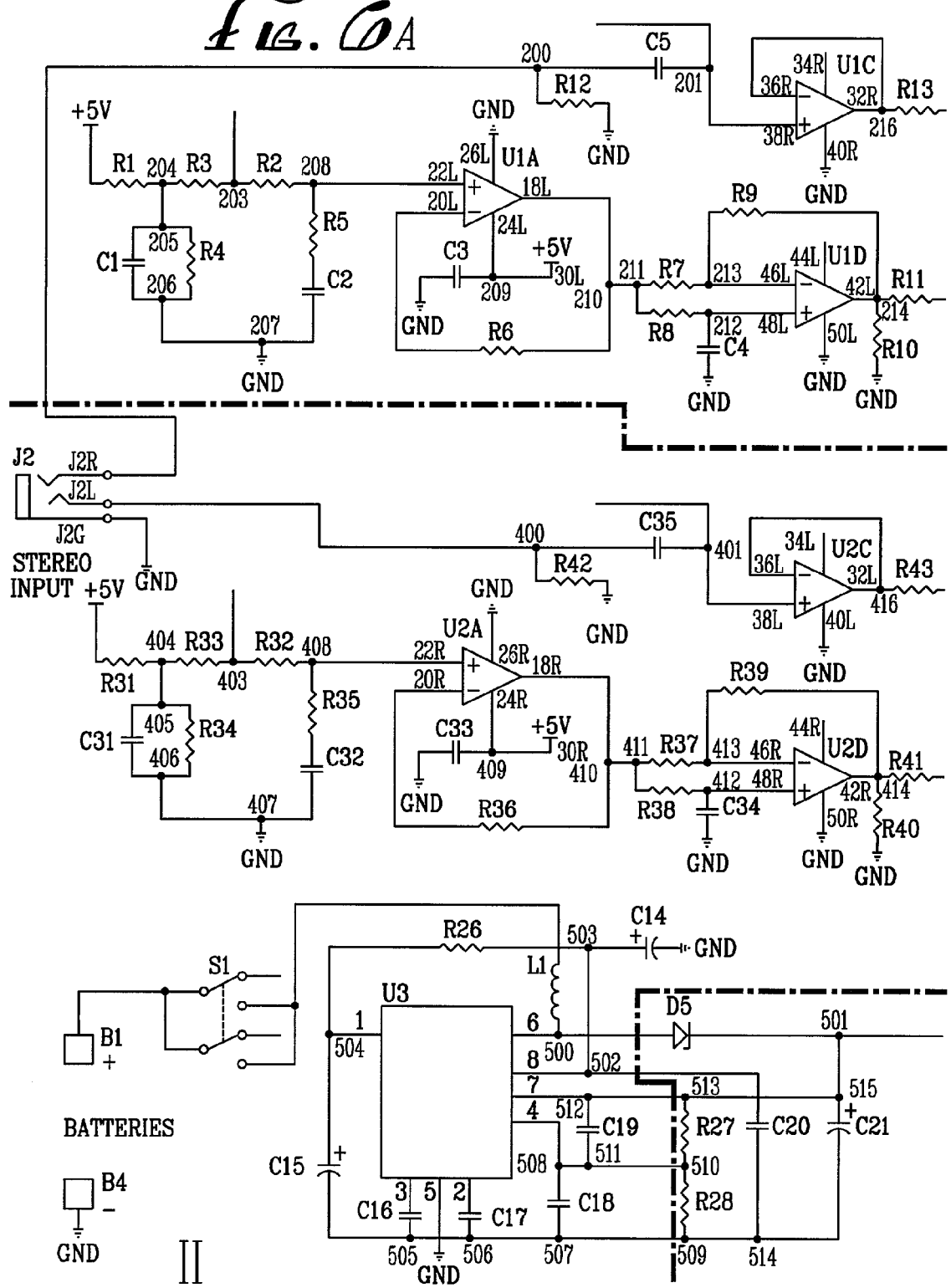
FIGS. 6A and 6B jointly show a base circuit diagram of a preferred circuit of the stereo headphone amplifier according to the present invention.
Figure 6B:
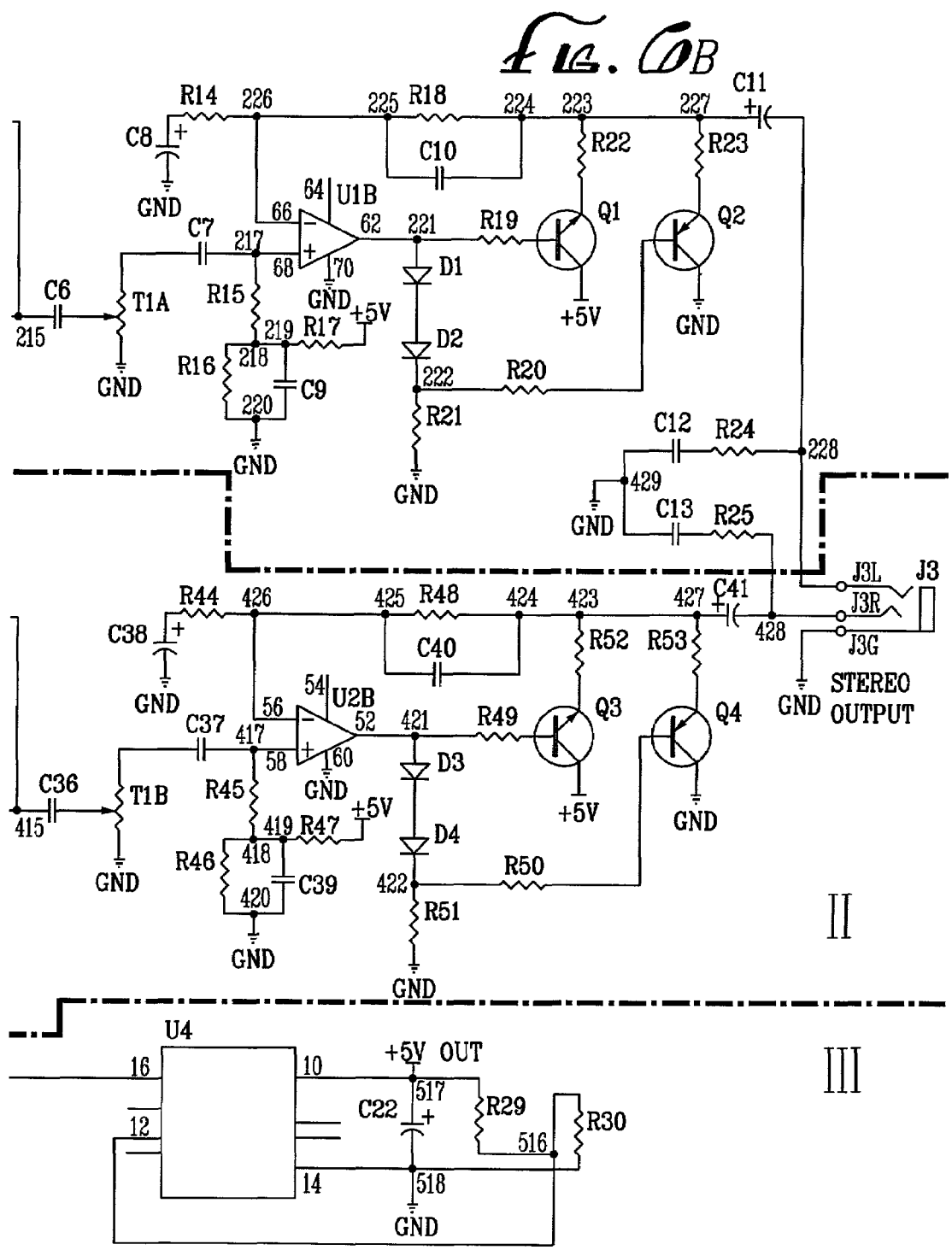

FIG. 2 is an external oblique view of the stereo amplifier case 90 showing its configuration and controls. In a preferred embodiment case 90 has overall external dimensions of approximately 2.4 inches by 4.2 inches by 0.9 inches. With respect to FIGS. 2 J2 and J3 show conventional 3 mm input and output audio jacks, respectively. Switch S1 is the power supply on/off switch. Volume control is provided by means of volume control wheel 86, which is rotatably connected to potentiometers T1A and T1B as shown in FIG. 6A and FIG. 6B. Advantageously jacks J2 and J3 are mounted on the same surface of case 90, that surface being the external surface on which all other controls are mounted, to facilitate use as a portable amplifier unit. By having the jacks mounted on the same surface, rather than on different surfaces, the unit more conveniently fits within a carrying case, a pocket, or other location and so the cords extending from and attached to the jacks, will be concentrated on one surface.

Figure 3:
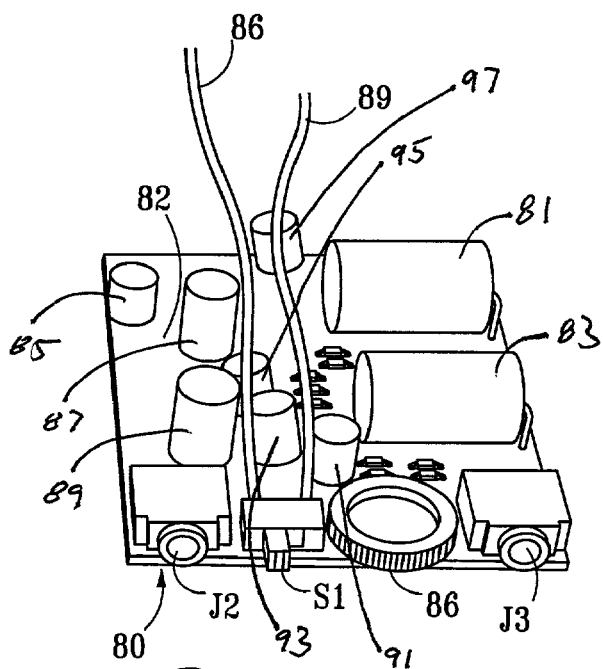
FIG. 3 is a view of the top surface of a preferred amplifier circuit board.

FIG. 3 illustrates circuit board 80 and depicts representative components installed on the top surface 82 of circuit board 80. For clarity, not all of the components contained in the amplifier circuits and power supply circuits are illustrated. In accordance with one preferred feature of the present invention, the larger components of the amplifier circuits and power supply circuits are installed on the top surface 82 of circuit board 80. Such components include audio signal input jack J2, audio signal output jack J3, power supply on/off switch S1 together with electrical conductors 88 and 89 which connect to a conventional battery power source. Also contained on top surface 82 is volume control wheel 86 which is mechanically rotatably connected with potentiometers T1A and T1B. Additional, relatively large components include C41 Capacitor 81, C11 Capacitor 83, C15 Capacitor 85, C22 Capacitor 87, C21 Capacitor 89, C14 Capacitor 91, L1 Inductor 93, and C8 Capacitor 95.

Figure 4:
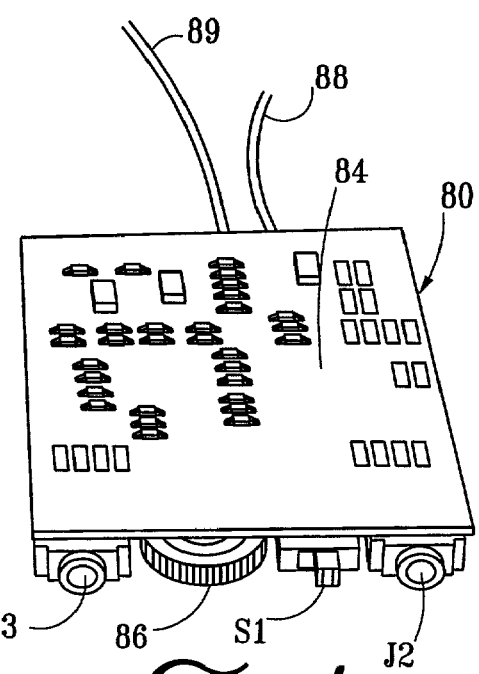
FIG. 4 is a view of the bottom surface of the FIG. 3 amplifier circuit board.

FIG. 4 illustrates the bottom surface 84 of circuit board 80 and upon which the smaller components of the stereo amplifier circuits and power supply circuits are installed as is shown by a stylized unnumbered representation of circuit components.

As is shown in FIGS. 3 and 4, the installation of circuit components on both the top surface 82 and bottom surface 84 of circuit board 80 advantageously permit the amplifier unit to be contained in a relatively small volume. This placement of components enables the use of compact case 90, which, in turn, provides for improved convenience and portability of the external amplifier of the present invention. A further advantage flowing from the installation of selected circuit components on opposite surfaces of the circuit board 80 provides for reduction in electrical interference between components, and thus, improves the clarity of the signals processed through the circuit. In a preferred embodiment, the amplifier circuitry for the two stereo audio channels are located on opposite sides of the circuit board 80.

FIG. 5 illustrates an external view of compact case 90 from a perspective opposite that of FIG. 2. Whereas FIG. 2 shows a perspective from the top and front of the case 90, FIG. 5 shows a perspective view from the bottom, rear of the case 90 case with the battery component case cover, not shown, removed. Battery compartment 72 is preferably sealed and isolated from that portion of case 90 which houses circuit board 80. Battery compartment 72 permits changing batteries without exposure of the amplifier circuits and power supply circuits. Because the battery compartment 72 is sealed from the compartment which houses circuit board 80, the amplifier circuits and power supply circuits are protected from contamination due to battery leakage and/or other contaminants that could cause damage to the circuits if permitted to enter the compartments in which the circuits are positioned. Additionally, a separate mounting of the battery provides an increased measure of protection against damage to the circuit board when the amplifier unit is dropped, or is otherwise struck. In prior art amplifiers, the battery is attached to the printed circuit board and, in the event the amplifier is dropped or hit, the momentum associated with movement of the battery is transferred directly to the printed circuit board and its components. In comparison, when the battery is separately mounted in a separate compartment, the momentum generated by the battery upon dropping of the unit, is not directly transferred to the circuit board and its components.

FIGS. 6A and 6B represent a highly stylized circuit diagram of the components of the stereo amplifier circuit 100. Reference symbols I, II and III denote regions into which the three major stereo amplifier circuit components are segregated on circuit board 80 in one preferred embodiment. It is to be understood, as previously described, that battery terminals B1, B4 are not mounted on the circuit board. Reference symbol II denotes those components mounted on the top surface 82 of circuit board 80. Reference symbols I and III denote those components mounted on the bottom surface 84 of circuit board 80.

Power Supply Circuit

Electrical power for the stereo amplifier preferably is provided by 3 volt batteries, AA size, at terminals B1 and B4 with the negative terminal B4 passing to ground. Positive battery terminal B1 is connected through double pole, double throw on/off switch S1 through 470 µH inductor L1 to junction 500, which connects with the LX pin 6 of a conventional negative buck regulator circuit U3. In a preferred embodiment the negative buck regulator U3 is a Maxim MAX752 step-up regulator. The regulator circuit is configured so the battery terminals float and the circuit's ground reference allows the output of the regulator to be positive. Junction 500 connects with junction 501 through a zener diode D5.

V+ pin 8 of the step-up regulator U3 connects to junction 502, and thence to junction 503, which passes to ground through 47 µF electrolytic capacitor C14. Junction 503 connects to junction 504 through 10,000 ohm ("10K") resistor R26 and thence to the shut down pin 1 of the step-up regulator U3. Terminal 504 connects to terminal 505 through 47 µF electrolytic capacitor C15 oriented with its positive terminal toward junction 504. Junction 505 connects to 0.1 µF capacitor C16 to the SS pin 3 of the step-up regulator U3. Junction 505 also connects to junction 506 through 0.01 µF capacitor C17 to the VREF pin 2 of the step-up regulator U3. Junction 506 connects to junction 507 through 2200 pF capacitor C18 to junction 508, which in turn connects to the CC pin 4 of the step-up regulator U3. Junction 507 connects to junction 509 and through 7.5K resistor R28 to junction 510. Junction 508 connects through junction 511 to junction 510. Junction 511 connects through 0.01 µF capacitor C19 to junction 512. The Vout pin 7 of the step-up regulator U3 connects with junction 512 which connects with junction 513 and through 31.6K resistor R27 to junction 510. Junction 509 connects with junction 514 which connects with junction 502 through 0.1 µF capacitor C20. Junction 514 connects with junction 515 through 470 µF electrolytic capacitor C21 oriented with its positive terminal toward junction 515. Junction 515 connects with junctions 513 and 501. The ground pin 5 of the step-up regulator U3 passes to ground. Utilizing the preferred 3 volt input, the output of the step-up regulator U3 is approximately 6.4 volts at junction 501. As is conventional, the step-up regulator provides for a higher voltage than that provided by the battery power source, in order to enable a useful and preferred dynamic range for the amplifier of the present invention.

Junction 501 connects with the input pin 16 of conventional voltage regulator U4. In a preferred embodiment voltage regulator U4 is a Linear Technology LT 1121 micropower low drop out regulator with shut down. The regulator U4 adjust pin 12 reference voltage is 3.75 volts referenced to ground. The adjust pin 12 is connected to junction 516 between 31.6K resistor R29 and 60K resistor R30. Resistor R30 is connected to junction 518 and thence to ground. The ground pin 14 of voltage regulator U4 is connected to junction 518 and thence to ground. Resistor R29 connects to junction 517 which connects to junction 518 470 µF electrolytic capacitor C22 oriented with its negative terminal toward ground. The output pin 10 of regulator U4 is connected to junction 517. A regulated output voltage greater than 5 volts positive with reference to ground is provided at junction 517 to other circuit components as indicated in the circuit schematic, FIGS. 6A and 6B, by the reference character +5V. Neglecting the small contribution of the adjust pin 12 current, the U4 output regulated voltage +5V is approximately equal to 5.7 volts.

Stereo Audio Amplifier Circuit

With reference to FIGS. 6A and 6B, left and right input audio signals (L, R) are applied at input phone jack J2. Input signal R is applied between conductor J2R and ground conductor J2G, and is directed along conductor J2R to junction point 200. Junction 200 is connected through 100K, resistor R12 to ground, and to 1.0 µF capacitor C5 and thence to junction point 201. At junction 201 audio input signal R is directed to junction 403 in region II between the 100K resistor R32 and the 280K resistor R33, and is directed to non-inverting terminal 38R of conventional operational amplifier ("op amp") U1C.

Regulated voltage is supplied to op amp U1C through terminal 34R in the manner described for op amp U2A as follows. Terminal 40R of op amp U1C passes to ground. The signal R output of op amp U1C at terminal 32R is fed back through junction 216 to inverting terminal 36R. Junction 216 connects the signal R channel output of op amp U1C through 10K resistor R13 to junction 215. Junction 215 receives the signal L channel output of conventional op amp U1D through 31.6K resistor R11. The signal R channel and signal L channel signals converge at junction 215 where the outputs of op amps U1C and U1D are combined. As may be appreciated, some of the left signal L is bled into the right channel and some of the right channel signal R is bled into the left channel amplifier. In this fashion, both of the stereo channels receive some sound input from the opposite channel, to thereby provide for a total sound experience which is more natural, in the sense that naturally occurring sounds are heard by both ears, with the sound generated closer to one ear dominating in that ear and the same sound, while being heard in the ear farther away from the sound's origination is less intense.

Junction 215 connects the combined signal R channel and signal L channel voltages through 1.0 µF capacitor C6 to volume control potentiometer T1A, one side of which is shunted to ground. The output from potentiometer T1A is connected to junction 217 through 1.0 µF capacitor C7.

Regulated voltage is supplied through 110K resistor R17 to junctions 219 and 218 and through parallel 110K resistor R16 and 1.0 µF capacitor C9 to ground through junction 220. Junction 218 connects through 280K resistor R15 to junction 217 and thence to noninverting terminal 68 of conventional op amp U1B. Regulated voltage is supplied to terminal 64 of op amp U1B in the manner described for terminal 24R of op amp U2A. Output terminal 62 of op amp U1B is connected to junction 221 which in turn is connected to the base of NPN transistor Q1 through 100 ohm resistor R19. Junction 221 is connected to junction 222 through diodes D1 and D2 in series and thence to ground through 2.74K resistor R21. Junction 222 is connected to the base of PNP transistor Q2 through 1000 ohm resistor R20.

Regulated voltage is supplied to the collector of transistor Q1. The emitter of transistor Q1 is connected to junction 223 through 100 ohm resistor R22. Junction 223 connects junction 224 and thence through parallel 68.1K resistor R18 and 130 pF capacitor C10 to junction 225. Junction 225 connects junction 226 and thence through 7.5K resistor R14 10 µF and electrolytic capacitor C8 to ground. Electrolytic capacitor C8 is connected with its negative terminal to ground as is conventional.

Junction 226 connects to inverting terminal 66 of op amp U1B. Thus, a gain control feedback network is established between the op amp output 62 through transistor Q1 and the filter (R18 and C10) to the inverting input 66 of op amp U1B.

The collector of PNP transistor Q2 is connected to ground. The emitter of transistor Q2 is connected through 10 ohm resistor R23 to junction 227 which connects with junction 223, thus coupling the emitters of transistors Q1 and Q2. Junction 227 connects with junction 228 through 470 µF electrolytic capacitor C11 oriented with its positive terminal toward junction 227. Electrolytic capacitor C11 is selected to have a predetermined specific frequency response over the audio frequency range. Junction 228 connects to junction 429 through 10 ohm resistor R24 and 0.1 µF capacitor C12 in series and thence to ground. Junction 228 connects with output conductor J3L of stereo output phone jack J3, to output an audio signal across conductor J3L and ground conductor J3G.

Regarding region II, the right channel amplifier circuit, regulated voltage is supplied through 110K resistor R31 to junction 404, which connects with junction 403 through 280K resistor R33 and thence to junction 405 through parallel filter network 110K resistor R34 and 1.0 µF capacitor C31 to junction 406 and then to ground through junction 407. Junction 407 connects through 560 pF capacitor C32 and 31.6K resistor R35 in series to junction 408. Junction 403 connects junction 408 through 100K resistor R32, and junction 408 connects conventional op amp U2A to direct signal R through non-inverting terminal 22R. Regulated supply voltage is supplied to op amp U2A through junction 409 to terminal 24R. Terminal 409 connects to ground through 0.1 µF capacitor C33. Terminal 26R of op amp U2A is connected to ground. The output of op amp U2A at terminal 18R is directed to a feedback connection with inverting terminal 20R through junction 410 and 10 ohm resistor R36 to control the gain of op amp U2A. Junction 410 connects junction 411 through parallel 10K resistor R37 and 300K resistor R38 to junctions 412 and 413 respectively. Junction 412 passes to ground through 560 pF capacitor C34 and connects to the non-inverting terminal 48R of conventional op amp U2D. Terminal 50R of op amp U2D passes to ground. Regulated voltage is supplied to terminal 44R of op amp U2D in the manner previously described for op amp U2A. The signal R output of op amp U2D at terminal 42R is passed through junction 414 and thence through 10K resistor R39 through junction 413 to a feedback connection at inverting terminal 46R. Junction 414 passes to ground through 68.1K resistor R40 and connects junction 415 through 31.6K resistor R41.

Input signal L is applied between conductor J2L and ground conductor J2G, and is directed along conductor J2L to junction point 400. Junction 400 is connected through 100K resistor R42 to ground, and to 1.0 µF capacitor C35 and thence to junction point 401. At junction 401 audio input signal L is directed to junction 203 in region I between 100K resistor R2 and 280K resistor R3, and is directed to non-inverting terminal 38L of conventional op amp U2C.

Regulated voltage is supplied through resistor R1 to junction 204, which connects with junction 203 through 280K resistor R3 and thence to junction 205 through parallel filter network 110K resistor R4 and 1.0 µF C1 to junction 206 and then to ground through junction 207. Junction 207 connects through 560 pF capacitor C2 and 31.6K resistor R5 in series to junction 208. Junction 203 connects junction 208 through 100K resistor R2, and junction 208 connects conventional op amp U1A to direct signal L through non-inverting terminal 22L. Regulated supply voltage is supplied to op amp U1A through junction 209 to terminal 24L. Terminal 209 connects to ground through 1.0 µF capacitor C3. Terminal 26L of op amp U1A is connected to ground. The output of op amp U1A at terminal 18L is directed to a feedback connection with inverting terminal 20L through junction 210 and 10 ohm resistor R6 to control the gain of op amp U1A. Junction 210 connects junction 211 through parallel 10K resistor R7 and 300K resistor R8 to junctions 212 and 213 respectively. Junction 212 passes to ground through 560 pF capacitor C4 and connects to the non-inverting terminal 48L of op amp U1D. Terminal 50L of op amp U1D passes to ground. Regulated voltage is supplied to terminal 44L of op amp U1D in the manner described for op amp U2A. The signal L output of op amp U1D at terminal 42L is passed through junction 214 and thence through 10K resistor R9 through junction 213 to a feedback connection at inverting terminal 46L. Junction 214 passes to ground through 68.1K resistor R10 and connects junction 215 through 31.6 resistor R11.

Regulated voltage is supplied to op amp U2C through terminal 34L in the manner described for op amp U2A. Terminal 40L of op amp U2C passes to ground. The signal L output of op amp U2C at terminal 32L is fed back through junction 416 to inverting terminal 36L. Junction 416 connects the signal L channel output of op amp U2C through 10K resistor R43 to junction 415. Junction 415 receives the signal R channel output of op amp U2D through 31.6K resistor R41. The signal L channel and signal R channel signals converge at junction 415 where the outputs of op amps U2C and U2D are combined.

Junction 415 connects the combined signal L channel and signal R channel voltages through 1.0 µF capacitor C36 to volume control potentiometer T1B, one side of which is shunted to ground. The output from potentiometer T1B is connected to junction 417 through 1.0 µF capacitor C37.

Regulated voltage is supplied through 110K resistor R47 to junctions 419 and 418 and through parallel 110K resistor R46 and 1.0 μF capacitor C39 to ground through junction 420. Junction 418 connects through 280K resistor R45 to junction 417 and thence to non-inverting terminal 58 of conventional op amp U2B. Regulated voltage is supplied to terminal 54 of op amp U2B in the manner described for terminal 24R of op amp U2A. Output terminal 52 of op amp U2B is connected to junction 421 which in turn is connected to the base of NPN transistor Q3 through 100 ohm resistor R49. Junction 421 is connected to junction 422 through diodes D3 and D4 in series and thence to ground through 2.74K resistor R51. Junction 422 is connected to the base of PNP transistor Q4 through 100 ohm resistor R50.

Regulated voltage is supplied to the collector of transistor Q3. The emitter of transistor Q3 is connected to junction 423 through 10 ohm resistor R52. Junction 423 connects junction 424 and thence through parallel 68.1K resistor R48 and 130 pF capacitor C40 to junction 425. Junction 425 connects junction 426 and thence through 7.5K resistor R44 and 10 μF electrolytic capacitor C38 to ground. Electrolytic capacitor C38 is connected with its negative terminal to ground as is conventional.

Junction 426 connects to inverting terminal 56 of op amp U2B. Thus, a gain control feedback network is established between the op amp output 52 through transistor Q3 and the filter (R48 and C40) to the inverting input 56 of op amp U2B.

The collector of PNP transistor Q4 is connected to ground. The emitter of transistor Q4 is connected through 10 ohm resistor R53 to junction 427 which connects with junction 423, thus coupling the emitters of transistors Q3 and Q4. Junction 427 connects with junction 428 through 470 μF electrolytic capacitor C41 oriented with its positive terminal toward junction 427. Electrolytic capacitor C41 is selected to have a predetermined specific frequency response over the audio frequency range. Junction 428 connects to junction 429 through 10 ohm resistor R25 and 0.1 μF capacitor C13 in series and thence to ground. Junction 428 connects with output conductor J3R of stereo output phone jack J3, to output an audio signal across conductor J3R and ground conductor J3G.

As may be seen from above, the proportion of the left channel signal entering into and being amplified in the right channel and, conversely, the degree to which the right input signal entering into and be amplified in the left channel is predetermined, rather than having separate controls for individual variations. As such, this predetermined crossover feature provides for a ready-to-use, simple construction tailored to the portability of the amplifier.

As also may be observed, the left channel and the right channel are identical to each other except that one is left, one is right, and a predetermined portion of the input signal from one channel is fed or bled into the opposite channel so that the output signal is a blend of the two input signals with the blended left output signal being dominated by the left input signal and the right output signal being dominated by the right input signal.

Also, as is readily apparent, all of the signals from each channel is sent over to the opposite channel but the crossover signal is amplified less in relation to the amplification of the primary signal in each channel.

As is also conventional, and may be seen in the drawings, this circuit provides for filtering before and after each amplification stage in order to minimize the amount of noise in the system. Also, the cables are conventional cables preferably about 12–36 inches in length and chosen to be compatible with a particular sound input device, such as a cassette player, or walkman type CD player, as well as compatible with particular headphones or earphones chosen for the particular uses and vision for the present invention, it is preferable that a relatively fixed, durable, wear resistant covering be provided for the cable, in that the cable preferably is not a twisted-pair type of a cable, but rather just 3 wires, including a left, right and ground wire, each with its own insulation, which in turn is surrounded by the durable cover.

Also, as may be appreciated, the present invention is without structures to provide for a typical residential wall outlet source of power. Rather, in the present invention, only a battery power supply is envisioned.

It will be understood that certain features and subcombinations are of utility and may be employed without reference to other features and subcombinations as they are outlined within the description above and within the claims appended hereto. While the preferred embodiments and application of the invention have been described, it is apparent to those skilled in the art that the objects and features of the present invention are only limited as set forth in the claims appended hereto.

We claim:

1. A headphone amplifier comprising:
    a housing having a first side;
    an audio signal input jack, an audio signal output jack, an on/off switch and a volume control positioned on said first side of the housing;
    a circuit board positioned inside of the housing;
    a battery compartment positioned inside of the housing and separated from said circuit board by a battier;
    a first channel audio amplification circuit positioned on a first side of the circuit board and adapted to amplify a first channel audio input signal;
    a second channel audio amplification circuit positioned on a second side of the circuit board adapted to amplify a second channel audio input signal;
    the first channel circuit adapted to re&eive the second channel audio input signal and to amplify the second channel input signal to a predetermined degree of amplification less than the amplification of the first channel input signal;
    the second channel circuit adapted to receive the first channel audio input signal and to amplify the second channel input signal to a predetermined degree of amplification less than the amplicalion of the first channel input signal.

2. The headphone amplifier of claim 1 further including:
    a power supply circuit coupled with said first channel audio amplification circuit;
    said power supply circuit being mounted on said circuit board.

3. A headphone amplifier as defined in claim 2 wherein said circuit board has top and bottom surfaces, and said circuits comprise two groups of components, a first group of larger components and a second group of smaller components, said larger components being mounted an said top surface and said smaller components being mounted on said bottom surface for compactness of the amplifier.

* * * * *